(12) United States Patent
Hayashi

(10) Patent No.: US 6,594,625 B2
(45) Date of Patent: Jul. 15, 2003

(54) METHOD FOR MODELING DIFFUSION OF IMPURITIES IN A SEMICONDUCTOR

(75) Inventor: Hirokazu Hayashi, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 178 days.

(21) Appl. No.: 09/781,421

(22) Filed: Feb. 13, 2001

(65) Prior Publication Data

US 2001/0025367 A1 Sep. 27, 2001

(30) Foreign Application Priority Data

Mar. 22, 2000 (JP) ........................................ 2000/084716

(51) Int. Cl.$^7$ .............................. G06F 17/10; G06F 7/60
(52) U.S. Cl. ................................................ 703/2; 716/1
(58) Field of Search .............................. 716/1, 4; 703/2, 703/14, 4

(56) References Cited

U.S. PATENT DOCUMENTS 6,154,717 A * 11/2000 Kumashiro

FOREIGN PATENT DOCUMENTS

JP  11-145068 * 5/1999 ........... H01L/21/22

OTHER PUBLICATIONS

Brut, H., et al., Physical model of threshold voltage in silicon MOS transistors including reverse short channel effect, Mar. 1995, IEEE, pp. 411–412.*

Suetake, M., et al., Precise physical modeling the reverse short channel effect for circuit simulation, Sep. 1999, IEEE, pp. 207–210.*

Bing–Yui, T., et al., Model and solution of reverse short channel effect, Jun. 1997, IEEE, pp. 237–240.*

Jacobs, H., et al., MOSFET reverse short channel effect due to silicon interstitial capture in gate oxide, Dec. 1993, IEEE, pp. 307–310.*

Sakamoto, H., et al., Simulation of reverse short channel effects with a consistent point defect diffusion model, Oct. 1997, IEEE, pp. 137–140.*

Wolf, S., Silicon processing for the VLSI era, Lattice Press, vol. 2, 1990, 31, 67, 663–669, 685, 689.*

* cited by examiner

Primary Examiner—John F. Niebling
Assistant Examiner—Stacy A Whitmore
(74) Attorney, Agent, or Firm—Volentine Francos, PLLC

(57) ABSTRACT

A semiconductor modeling method capable of simulating impurity pileup at a Si/SiO$_2$ interface, and analyzing electrical characteristics (for example, substrate bias dependency) of a semiconductor, dependent on impurity concentration, under high speed calculation. A portion of impurities in a Si substrate region is caused to migrate to the Si/SiO$_2$ interface, there by constituting an impurity pileup part. With such a method, it becomes possible to express the impurity pileups at the Si/SiO$_2$ interface, which could not be expressed with the use of the conventional Fair model, without finding the solution to diffusion equations associated with point defects, that is without the use of the conventional pair diffusion model.

24 Claims, 16 Drawing Sheets

CALCULATION OF IMPURITY DIFFUSION $t_E$: TED DURATION TIME
tend: HEAT TREATMENT TIME

C : IMPURITY CONCENTRATION
ΔC : IMPURITY MIGRATION AMOUNT
ΔS : CELL AREA

FIG. 4
RECALCULATION OF AN IMPURITY MIGRATION AMOUNT ON RESPECTIVE CELLS ASSUMING THAT THE SUM TOTAL OF MIGRATION AMOUNTS IS "1"
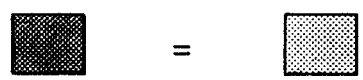
PRESERVATION !
■ IMPURITY PILEUP AMOUNT (INCREMENT)
☐ IMPURITY MIGRATION AMOUNT
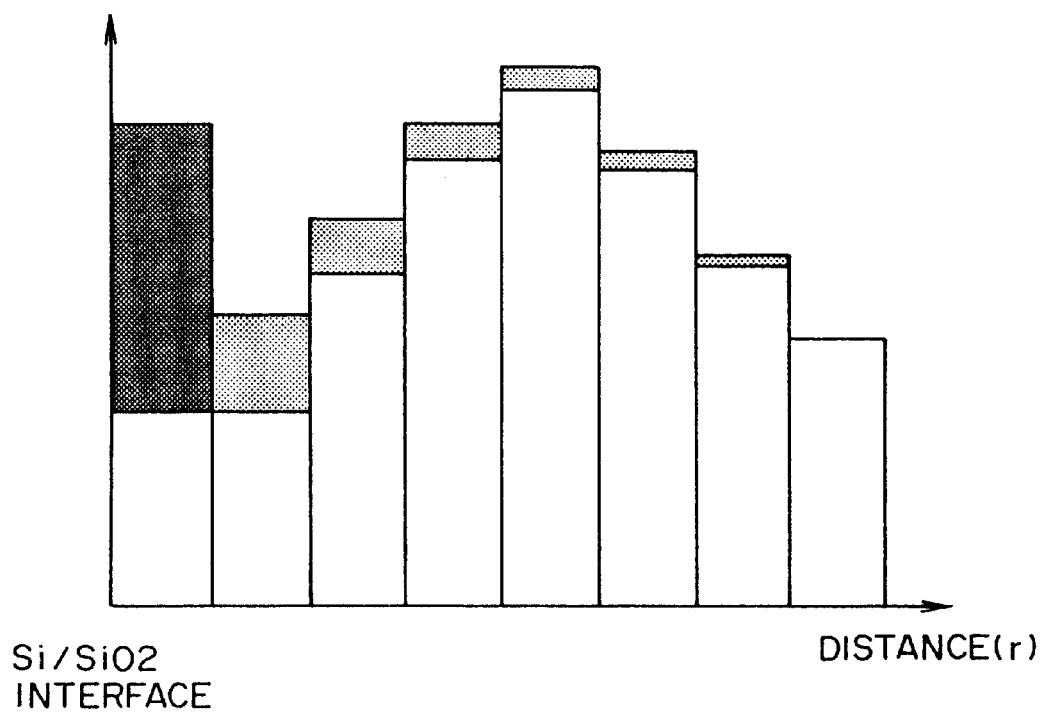

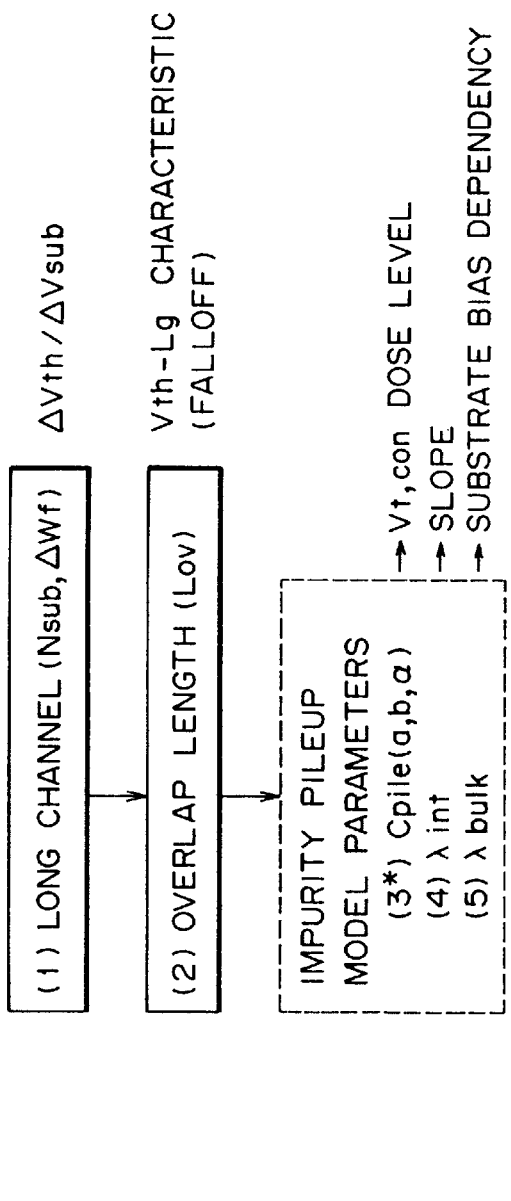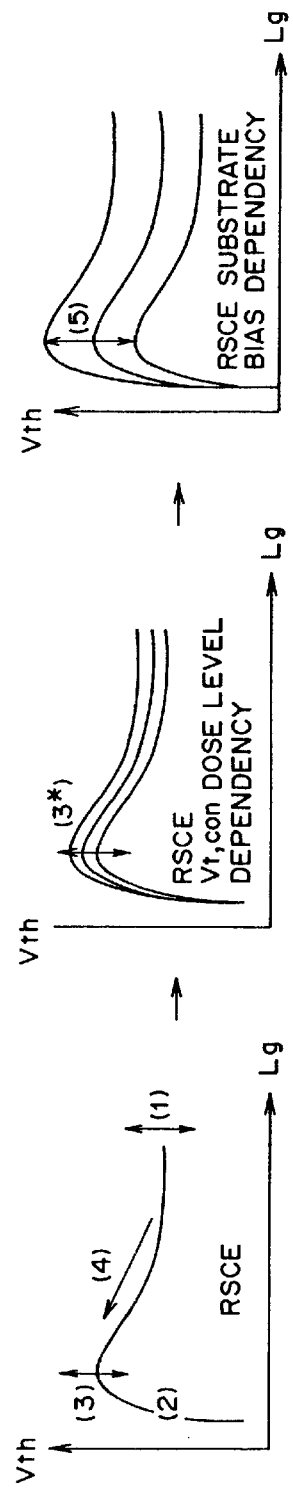
FIG.8

FIG.10

CASE OF USING AN INTERPOLATION FORMULA
DERIVED FROM THREE MODEL PARAMETERS
UNDER DIFFERENT PROCESS CONDITIONS

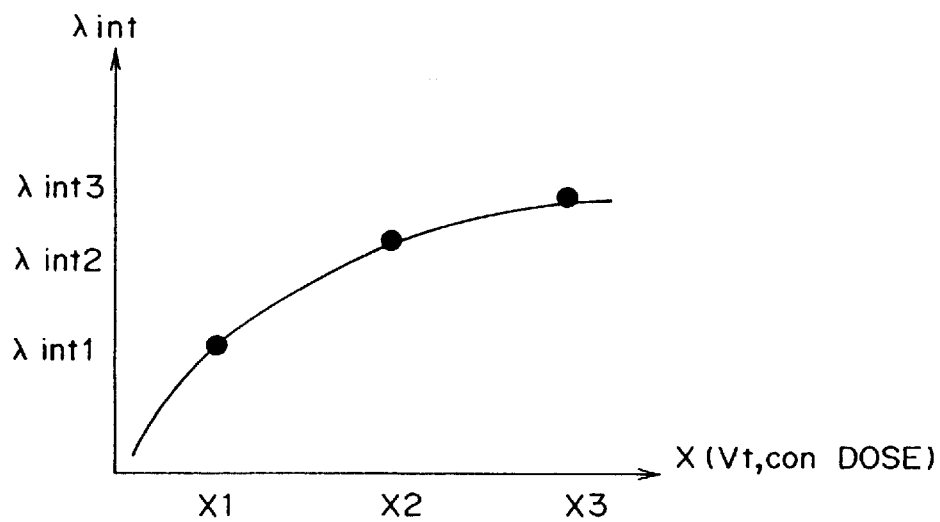

$$\begin{pmatrix} X1^2 & X1 & 1 \\ X2^2 & X2 & 1 \\ X3^2 & X3 & 1 \end{pmatrix} \begin{pmatrix} a \\ b \\ c \end{pmatrix} = \begin{pmatrix} \lambda\,\text{int1} \\ \lambda\,\text{int2} \\ \lambda\,\text{int3} \end{pmatrix}$$

CALCULATED BY CRAMER'S FORMULA $\lambda\,\text{int}(x) = ax^2 + bx + c$

X : PROCESS CONDITION
(THRESHOLD VOLTAGE CONTROL
IMPLANTATION DOSE, ETC.)

a,b,c : PARAMETERS (WORKED OUT FROM
MATRIX CALCULATION)

No.1 - 3  PROCESS LEVELS

FIG.13
(PRIOR ART)

Fair MODEL $$\partial C_A / \partial t = -\nabla J_A$$

PAIR DIFFUSION MODEL $$\partial C_I / \partial t + \Sigma \, \partial C_{AI} / \partial t = -\nabla J_I - \Sigma \nabla J_{AI} - R_{I.V} + R_{IV}$$

$$\partial C_V / \partial t + \Sigma \, \partial C_{AV} / \partial t = -\nabla J_V - \Sigma \nabla J_{AV} - R_{I.V} + R_{IV}$$

$$\partial C_{Atotal} / \partial t = \nabla \{D_{AI} \, C_{Atotal} \, (C_I/C_I^*) \, \nabla \log(pC_{Atotal} \, C_I/C_I^* \, n_i)\} +$$
$$\nabla \{D_{AV} \, C_{Atotal} \, (C_V/C_V^*) \, \nabla \log(pC_{Atotal} \, C_V/C_V^* \, n_i)\}$$

A = all dopant species, I = interstitial, V = vacancy

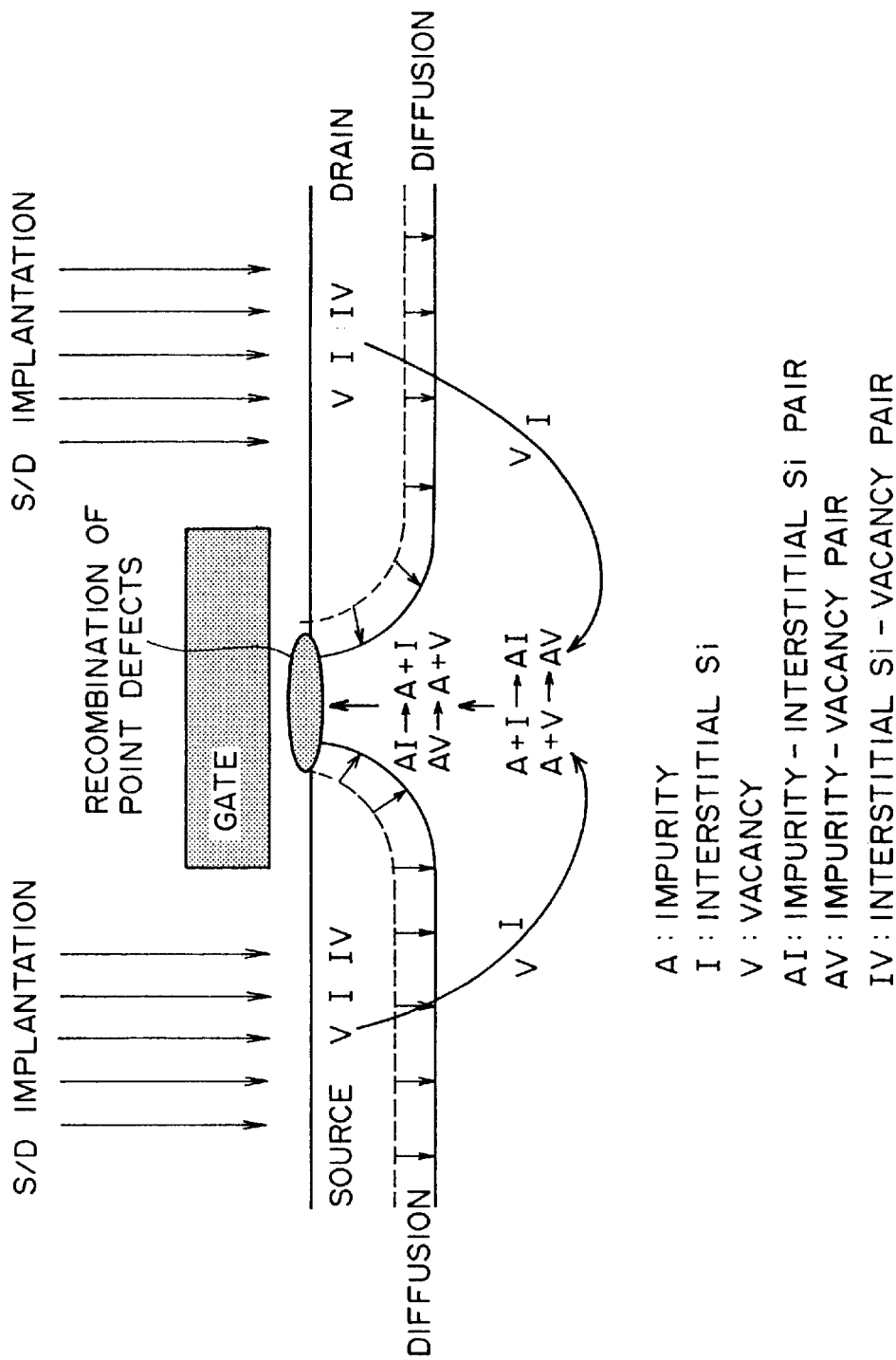

FIG. 15
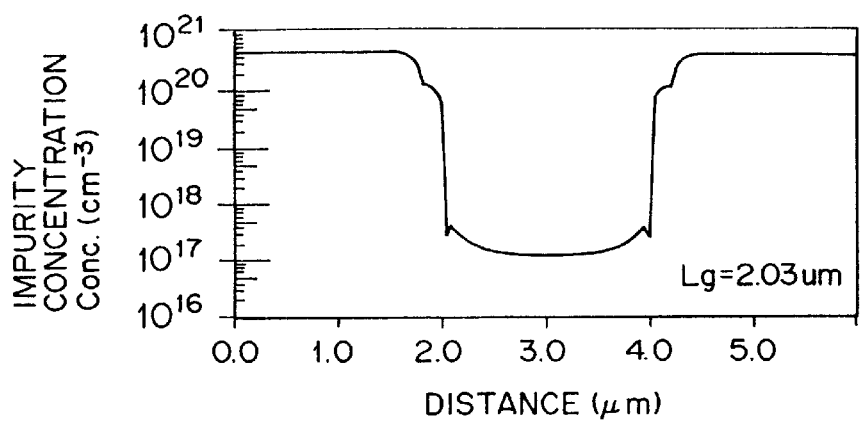
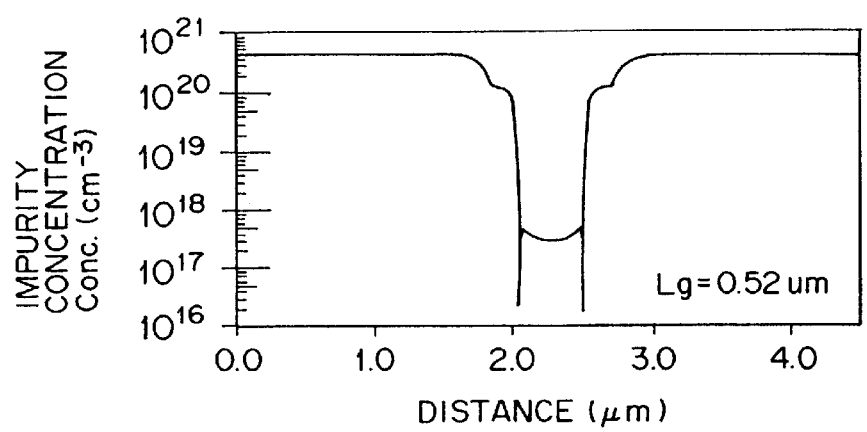
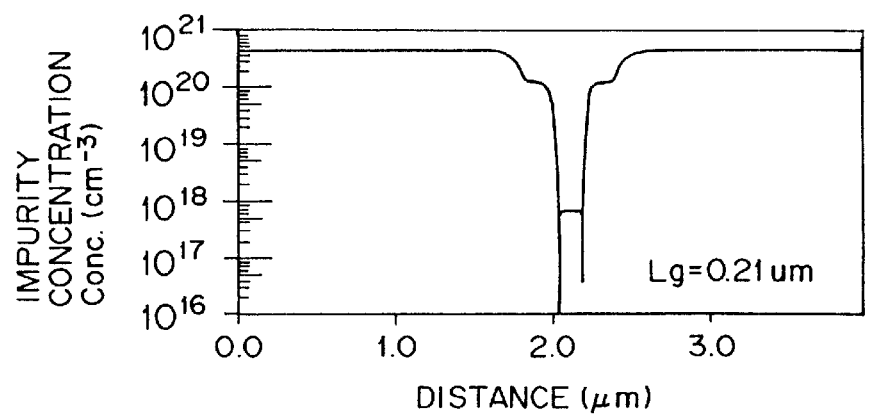

METHOD FOR MODELING DIFFUSION OF IMPURITIES IN A SEMICONDUCTOR

BACKGROUND OF THE INVENTION

1. Field of the Invention

The present invention relates to a semiconductor modeling method for modeling impurity diffusion in a semiconductor, and a reverse short channel effect (RSCE) of a threshold voltage of a MOS field effect transistor (MOSFET). This application is a counterpart application of Japanese application Serial Number 084716/2000, filed Mar. 22, 2000, the subject matter of which is incorporated herein by reference.

2. Description of Related Art

As shown FIG. 13, the conventional model representing impurity diffusion in a semiconductor can be classified into the following two types of models. One is a model (hereinafter referred to as Fair model) obtained by setting a target region for analysis, and finding the solution to a diffusion equation for respective impurities, thereby calculating impurity distribution in the semiconductor. The other is a model (hereinafter referred to as Pair Diffusion Model) obtained by setting a target region for analysis, and finding the solution to a diffusion equation for respective point defects themselves and respective impurity-point defect pairs, on the assumption that the respective point defects and the respective impurities form pairs and are diffused, thereby calculating impurity distribution in the semiconductor.

The Fair model has an advantage in that since the number of equations to be solved is only a few, it takes less time in calculation, so that results of a semiconductor simulation can be obtained in a short time. In this case, however, the effect of the point defects on impurity diffusion is not reflected in the diffusion equation, and the same is coped with by increasing or decreasing model parameters such as the diffusion constant, and so forth, and consequently, there has been a risk of simulation precision undergoing deterioration in case that the effect of the point defects on impurity diffusion is significant.

On the other hand, the Pair Diffusion Model has an advantage in that since the effect of the point defects on impurity diffusion is fully taken into account, simulation with high-precision can be achieved, however, this model has had a drawback in that a longer time is required for calculation because the number of equations to be solved increases according as the number of impurities increases.

Owing to such characteristics of the respective models, it has been a general practice to choose the Fair model in the case where a simulation with a predetermined precision can be anticipated by adjusting model parameters, and to choose the pair diffusion model in all other cases.

Now, the mechanism of impurity diffusion in the case where excessive point defects exist in a semiconductor is described hereinafter with reference to FIG. 14. Excessive point defects occur mainly during a step of ion implantation with a high dose. In particular, excessive point defects occurring in a step of source/drain (S/D) ion implantation into a MOSFET end up pairing up with respective impurities by heat treatment applied immediately thereafter. The respective impurity-point defect pairs are diffused while repeating separation and recombination. Since the point defects cease to exist upon reaching the $Si/SiO_2$ interface, the impurities pairing up therewith are deposited (piled up) on the spot. FIG. 15 shows relationships between distance in the longitudinal direction of the channel (Distance) and impurity concentration (Conc.) in the case of a gate length being 2.03 μm, 0.52 μm, and 0.21 μm, respectively. In the figure, a region of low impurity concentrations corresponds to the channel, and in regions on the opposite sides of the region, corresponding to the source and the drain, respectively, a rise in impurity concentration due to impurity pileup is observed.

A pileup amount reaches the maximum value at the edges of the gate, close to the position where the S/D ion implantation has been carried out, and decreases towards the channel. It is regarded that the reverse short channel effect of a MOSFET, whereby the threshold voltage becomes higher according as the gate length becomes shorter, occurs mainly due to the impurity pileup.

FIG. 16 shows relationships between the gate length Lg and the threshold voltage Vth in the case of the substrate bias VB at 0V, −3V, and −5V, respectively.

With a semiconductor device, as dimensions of the device are reduced in an attempt to enhance response speed and a degree of integration, the gate length generally becomes shorter correspondingly. Meanwhile, it is desirable from the viewpoint of circuit designing that the threshold voltage Vth remains constant regardless of the gate length Lg, however, as the gate length Lg becomes shorter (not longer than 1 μm in FIG. 16), the reverse short channel effect whereby the threshold voltage Vth undergoes variation, up and down, is observed.

In the conventional modeling of the reverse short channel effect of the threshold voltage of a MOSFET, the following methods have been adopted:

(1) a method of finding electrical characteristics by calculating impurity distribution by use of the Fair model, and by using a fixed electric charge or other factors (for example, an oxide film at the edges of the gate, with thickness Tox, rendered thicker) in place of the impurities piled up; or (2) a method of finding electrical characteristics directly by calculating impurity distribution by use of the pair diffusion model.

However, with the conventional methods (1) and (2) as described above, several problems have been encountered as follows:

1. with the Fair model, it is impossible to simulate the impurity pileup at the $Si/SiO_2$ interface;

2. with the Fair model, even by use of the fixed electric charge, and so forth, in place of the impurity piled up, the profile of the impurities is not altered. Accordingly, it is impossible to analyze in detail electrical characteristics such as, for example, dependency of the reverse short channel effect on impurity concentration in the substrate of the MOSFET, or dependency of the reverse short channel effect on the substrate bias;

3. with the pair diffusion model, since a longer time is required for calculation as described in the foregoing, it becomes difficult to adopt the pair diffusion model from the viewpoint of attaining high efficiency in simulation in case that there is the need of executing calculation a plurality of times such as sensitivity analysis of process/device/inter-circuit, process optimization, process fluctuation analysis, calibration of the model parameters, and so forth; and 4. with the pair diffusion model, point defects having high diffusion speeds are dealt with. Accordingly, it is required that a computer for use in simulation has a sufficient space for analysis with the result that a memory for calculation, having a large capacity, becomes indispensable.

In order to overcome the problems as described in the foregoing, the invention has been developed, and it is an object of the invention to provide a semiconductor modeling method, capable of simulating the impurity pileup at the Si/SiO$_2$ interface, and also capable of analyzing electrical characteristics dependent on the impurity concentration (for example, dependency on the substrate bias) under high-speed calculation.

SUMMARY OF THE INVENTION

For solving the problems as described above, in accordance with a first aspect of the invention, there is provided a semiconductor modeling method comprising a first step of storing data on an SiO$_2$ layer, a second step of storing data on an Si layer formed so as to be in contact with the SiO$_2$ layer, a third step of dividing the Si layer into a plurality of regions, and setting an amount of impurity contained in the respective regions, a fourth step of setting an inter-regional migration amount of the impurity contained in the respective regions for a unit of time, a fifth step of constituting an impurity pileup part in the vicinity of an interface between the SiO$_2$ layer and the Si layer, and a sixth step of calculating impurity distribution in the respective regions for every unit of time after completion of the first, second, third, fourth and fifth steps. With such a method, it becomes possible to express the impurity pileups at the Si/SiO$_2$ interface, which could not be expressed with the use of the conventional model (Fair model) whereby one diffusion equation is solved for one calculation of impurity concentration, without finding the solution to diffusion equations associated with point defects (that is, without the use of the conventional pair diffusion model).

BRIEF DESCRIPTION OF THE DRAWINGS

FIG. 4 is a schematic representation illustrating a third embodiment of a semiconductor modeling method according to the invention;

FIG. 8 is a schematic representation (1) illustrating a seventh embodiment of a semiconductor modeling method according to the invention;

FIG. 10 is a schematic representation illustrating an eighth embodiment of a semiconductor modeling method according to the invention;

FIG. 13 is a schematic illustration showing two kinds of conventional models of impurity diffusion;

FIG. 14 is a schematic illustration showing the mechanism of impurity diffusion;

FIG. 15 is a diagram of a characteristic curve showing relationships between distance in the longitudinal direction of the channel and impurity concentration;

DETAILED DESCRIPTION OF THE INVENTION

Figure 1:
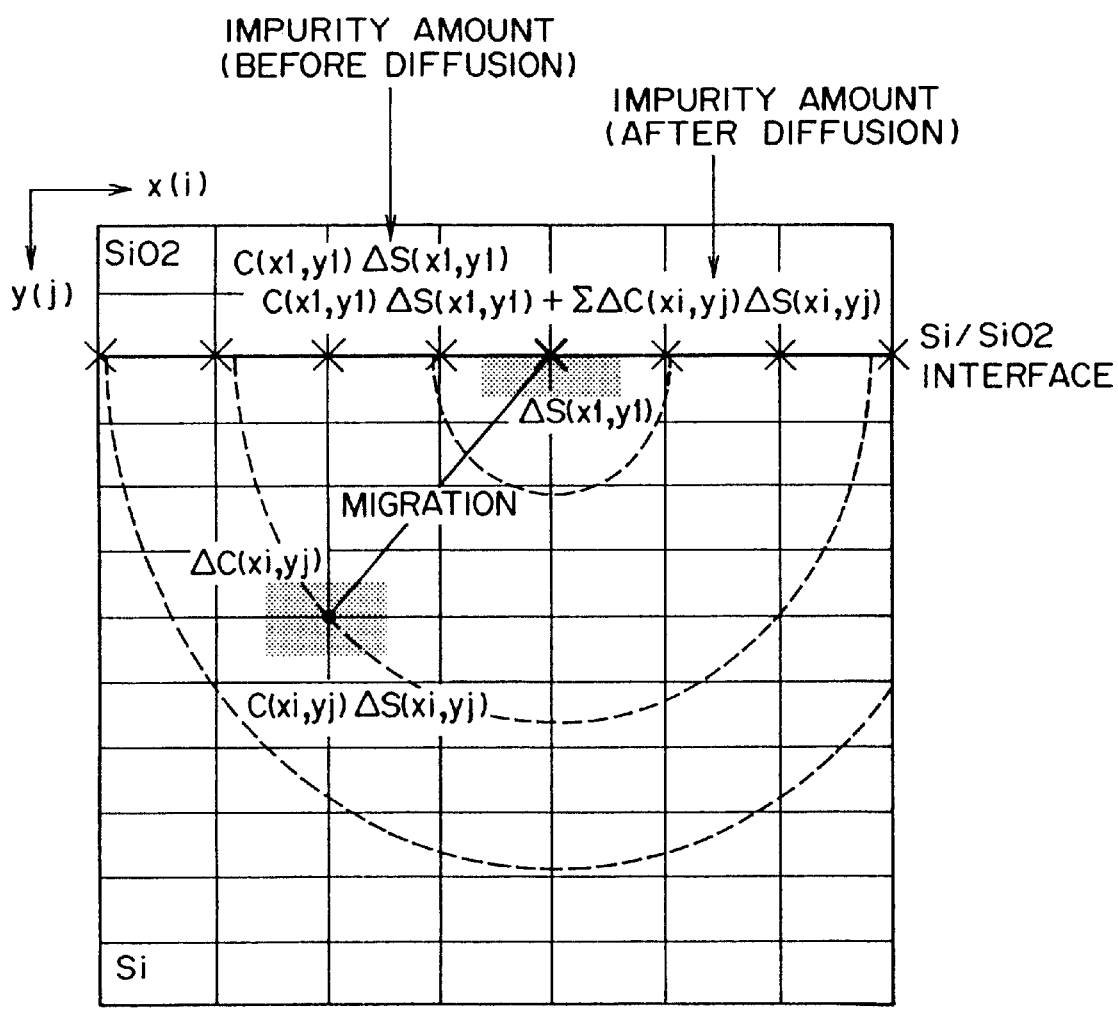
FIG. 1 is a schematic representation illustrating a first embodiment of a semiconductor modeling method according to the invention.

Preferred embodiments of a semiconductor modeling method according to the invention are described in detail hereinafter with reference to the accompanying drawings. In the following description and the accompanying drawings, constituent elements having substantially the same function and the same constitution are denoted by the same reference numerals, thereby omitting duplicated description.

First Embodiment

Figure 2:
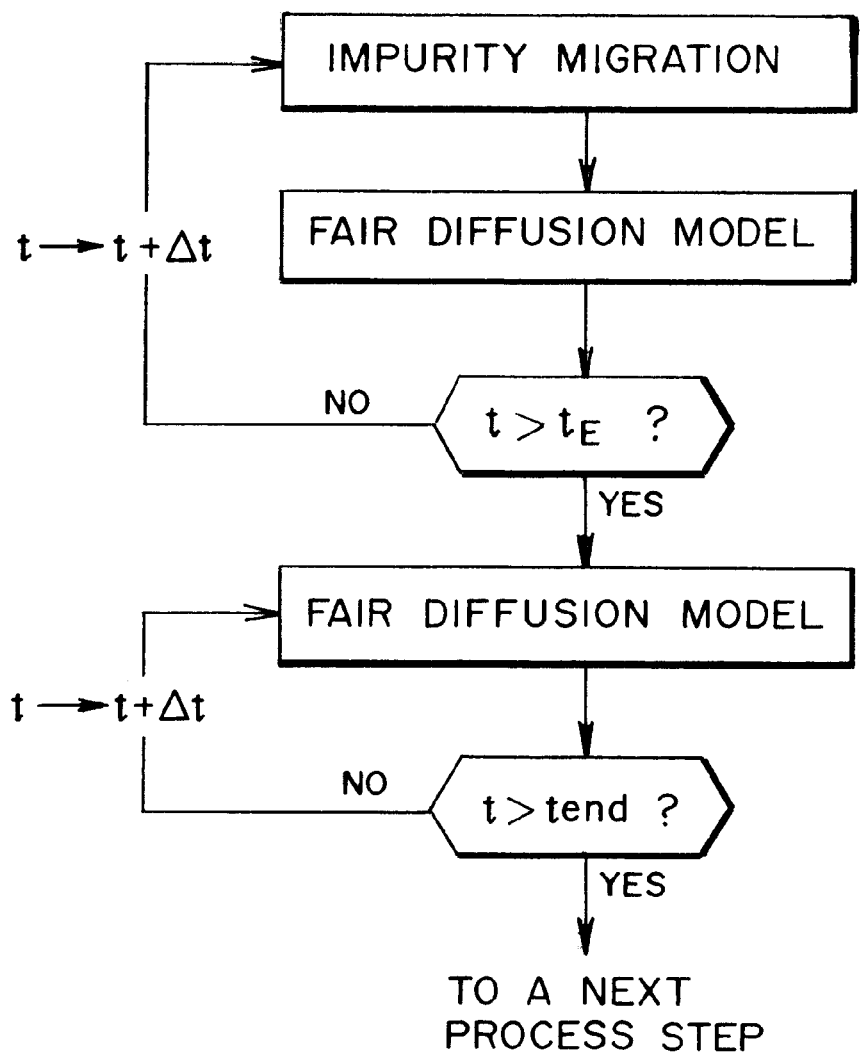
FIG. 2 is a flow chart showing steps of the first embodiment of the semiconductor modeling method according to the invention.
Figure 17:
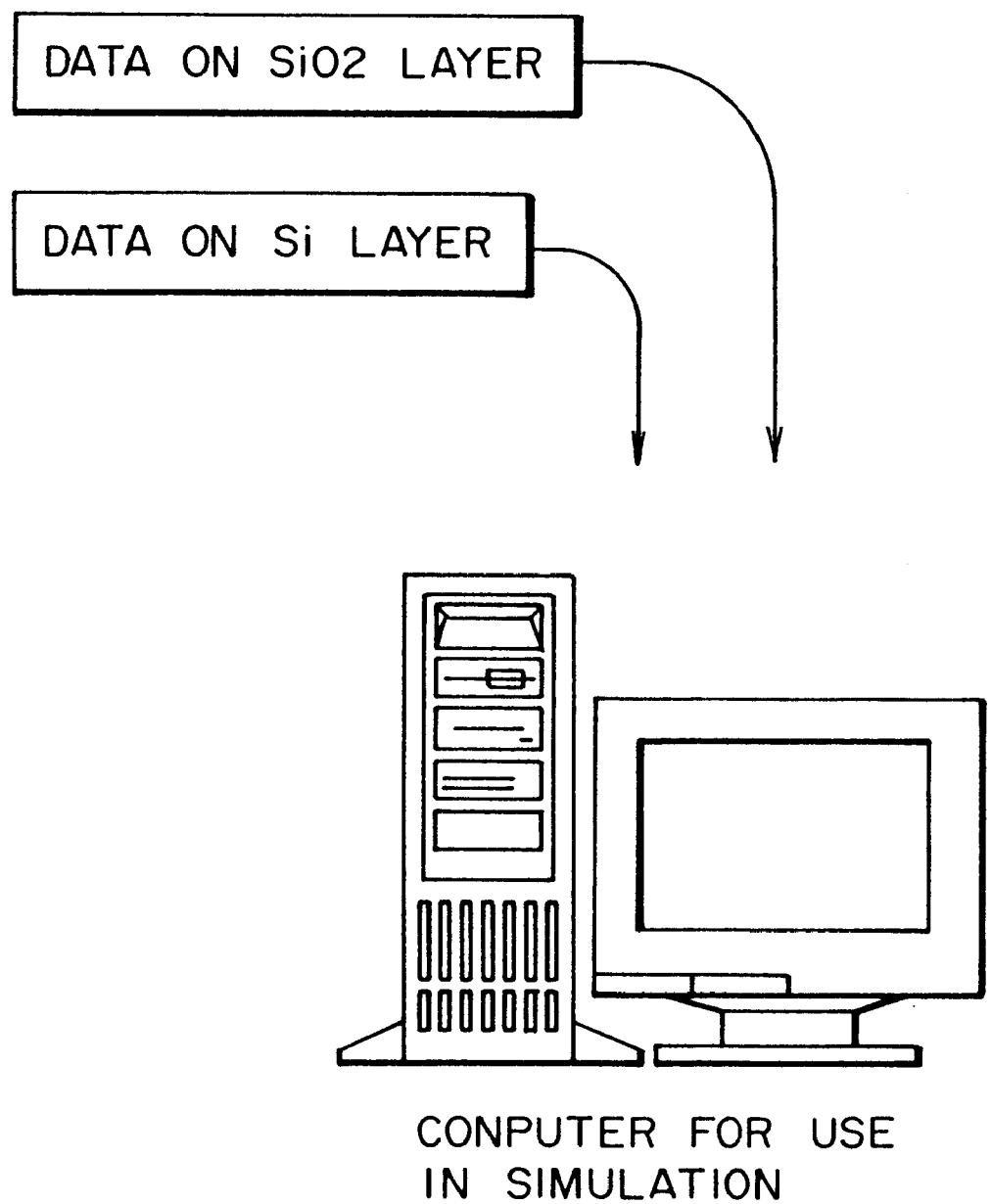
FIG. 17 is a block diagram showing a computer for use in simulation and data to be inputted thereto.

A first embodiment of a semiconductor modeling method according to the invention is described hereinafter with reference to FIGS. 1, 2, and 17.

In the case of simulating a semiconductor having an SiO$_2$ layer and an Si layer adjoining to the SiO$_2$ layer, a step of inputting data on the SiO$_2$ layer as well as the Si layer to a computer for use in simulation is first executed. Thereafter, a characteristic step of the first embodiment of the semiconductor modeling method according to the invention, that is, a step of causing a portion of impurities in a Si substrate region to migrate to a Si/SiO$_2$ interface, thereby constituting an impurity pileup part, is executed. With such a method, it becomes possible to express impurity pileups at the Si/SiO$_2$ interface, which could not be expressed with the use of the conventional Fair model, without finding the solution to diffusion equations associated with point defects (that is, without the use of the conventional pair diffusion model).

With the conventional Fair model, an impurity {for example, boron (B)} was diffused simply from regions of higher concentration to regions of lower concentration, but it was impossible to express a pileup phenomenon wherein boron is diffused towards the Si/SiO$_2$ interface containing boron in low concentration in such a way as to increase boron concentration along that direction contrary to the former case.

Accordingly, in a step of calculating impurity diffusion by finding the solution to a diffusion equation for every Δt, a portion of an impurity in a cell (region obtained by dividing the target region for analysis into a number of sub-regions for numerical calculation) of the substrate region is first caused to migrate to the Si/SiO$_2$ interface. Such an operation step of causing impurity migration is applied to all the cells. As shown in FIG. 2, this step is repeated up until the elapse of a preset TED (transient enhanced diffusion) duration time tE. After the elapse of the duration time tE, the substantially same calculation as the conventional one is executed.

Thus, with the first embodiment of the semiconductor modeling method according to the invention, the impurity pileups can be expressed in the category of the Fair model which does not deal with point defects, without the use of the pair diffusion model. It therefore becomes possible to speed up analysis of various electrical characteristics dependent on impurity concentration. Furthermore, as a memory region required for calculations is considerably reduced in comparison with that in the case of using the pair diffusion model, it becomes unnecessary to use a memory having a large capacity.

Second Embodiment

A second embodiment of a semiconductor modeling method according to the invention is described hereinafter with reference to FIGS. 2 and 3.

The semiconductor modeling method according to the second embodiment of the invention is characterized in that a portion of impurities in a Si substrate region is caused to migrate to a Si/SiO$_2$ interface, thereby constituting impurity pileup as with the case of the semiconductor modeling method according to the first embodiment of the invention, and further, such a impurity migration amount is given as the function of a distance from a location from which an impurity has migrated to a location of the pileup.

In the case of expressing the impurity migration amount as the function of the distance, the following two methods are preferably chosen.

Figure 3A:
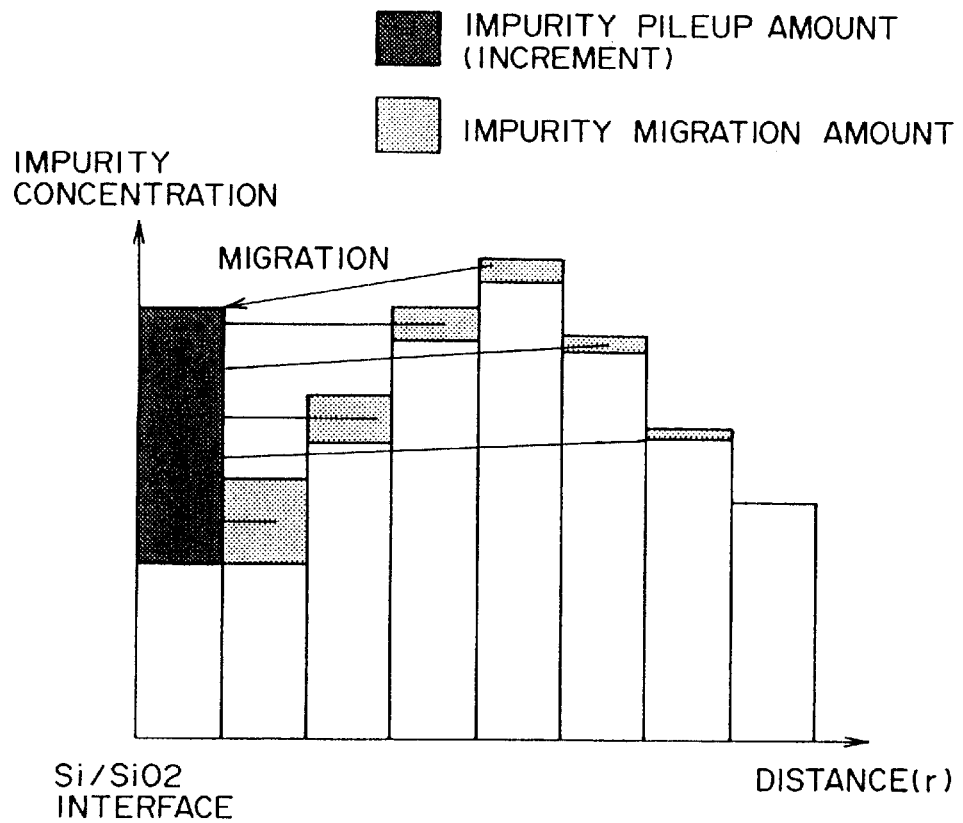
FIG. 3 is a schematic representation illustrating a second embodiment of a semiconductor modeling method according to the invention.

(1). a method of using an analytic formula such as the exponential function of a distance (r), Gaussian distribution, error function, spherical equation, and so forth {FIG. 3(a)}.

For example, in the case of using the exponential function, the analytic formula is:

$$\Delta C(X, Y) = Cint(x) X \exp(-r/\lambda bulk) \quad (1)$$

where $\Delta C (X, Y)$ denotes an impurity migration amount, Cint (x) an impurity pileup amount on one of the cells at the Si/SiO$_2$ interface, and $\lambda$ bulk an attenuation length.

Figure 3B:
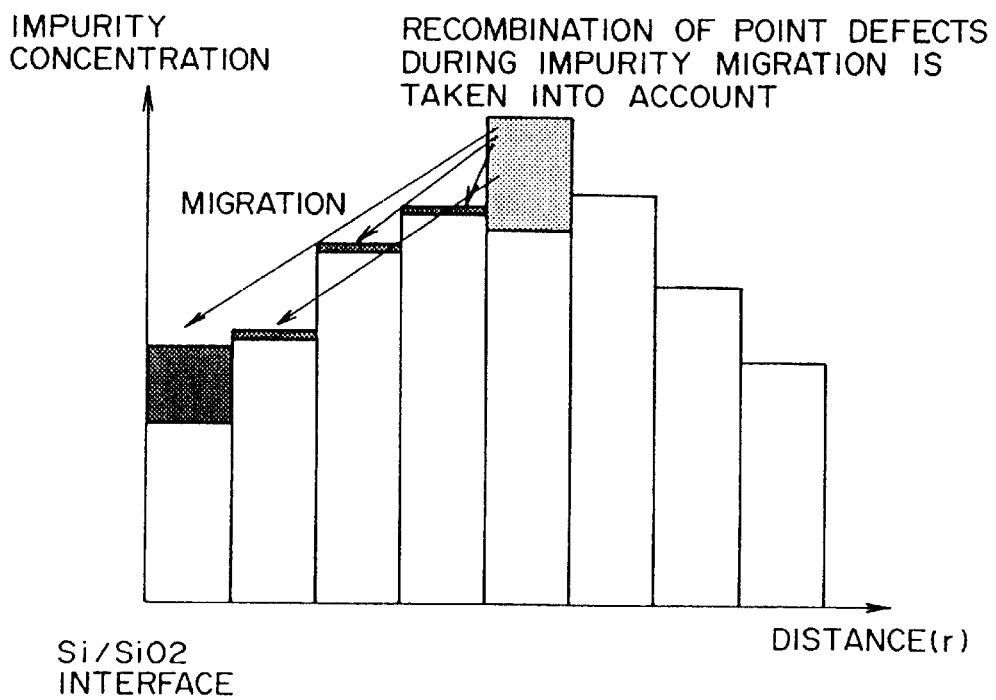

(2). a method of taking into account recombination of an impurity with a point defect during migration of the impurity by solving a one-dimensional pair diffusion model {FIG. 3(b)}.

With the method (1) as described above, the impurity migration amount can be calculated at a high speed, so that the method has high usefulness in semiconductor modeling. In contrast, with the method (2) as described above whereby variation in impurity concentration on respective cells due to recombination of an impurity with a point defect during migration of the impurity is taken into account, the impurity migration amount can be calculated with higher precision. Furthermore, since one-dimensional calculation is adopted in this case, it becomes possible to execute high speed calculation while holding back an increase in the scale of a memory for calculation.

Third Embodiment

A third embodiment of a semiconductor modeling method according to the invention is described hereinafter with reference to FIG. 4.

Although a portion of impurities is caused to migrate from a Si substrate region to a Si/SiO$_2$ interface, a total impurity amount in the Si substrate before migration needs to be preserved after the migration. The semiconductor modeling method according to the third embodiment of the invention is characterized in that a step of causing a portion of the impurities to migrate while preserving a total amount of impurities in a target region for analysis is added to the semiconductor modeling method according to the second embodiment of the invention. More specifically, by defining a distribution function whereby the sum total of the products of an impurity migration amount as calculated and a cell area is assumed to be "1", an impurity migration amount is recalculated.

In the case of finding the impurity migration amount using the exponential function, an impurity migration amount $\Delta C (X, Y)$ obtained by the expression (1) is further calculated by the following expression to find an impurity migration amount $\Delta C (X, Y)^*$:

$$\Delta C(X, Y)^* = \Delta C(X, Y) \cdot (1/\text{UNIT}) \quad (2)$$

where 1/UNIT is found by the following expression;

$$1/\text{UNIT} = Cint(x) \cdot \Delta S(x, y) \Sigma \Delta C(xi, yj) \cdot \Delta S(xi, yj) \quad (3)$$

And $\Delta S (x, y)$ is a cell area at an optional location on the x-coordinate and the y-coordinate.

Thus, with the semiconductor modeling method according to the third embodiment of the invention, even if the impurity migration amount as calculated contains an error, a highly accurate impurity migration amount can be obtained because a total amount of impurities in a semiconductor is preserved.

Fourth Embodiment

Figure 5:
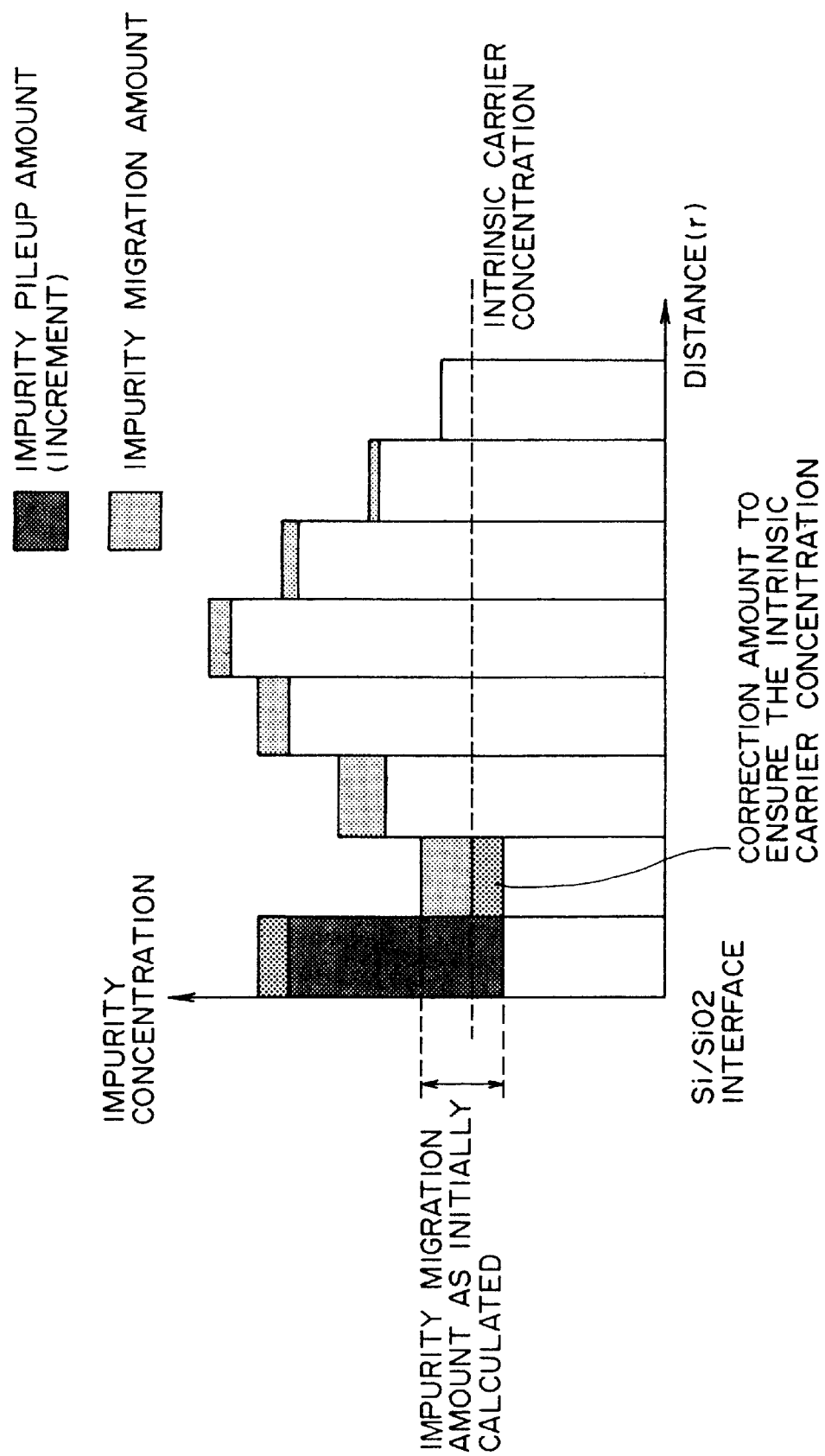
FIG. 5 is a schematic representation illustrating a fourth embodiment of a semiconductor modeling method according to the invention.

A fourth embodiment of a semiconductor modeling method according to the invention is described hereinafter with reference to FIG. 5.

With an extrinsic semiconductor, there can not generally occur regions having concentration not higher than the intrinsic carrier concentration. In this connection, the semiconductor modeling method according to the fourth embodiment of the invention has a step of recalculating an impurity migration amount using the following expression so as not to render impurity concentration to become not higher than the intrinsic carrier concentration in case that after an impurity is caused to migrate from a region by the semiconductor modeling method according to the second embodiment of the invention, impurity concentration in the region (on a cell) otherwise comes down to not higher than the intrinsic carrier concentration:

(impurity concentration on respective cells)–(the intrinsic carrier concentration) (4)

Thus, with the semiconductor modeling method according to the fourth embodiment of the invention, it is possible to avoid convergence towards an erroneous numerical solution, thereby achieving enhancement of convergence and stability of simulation, and improvement on simulation accuracy from physical property aspects.

Fifth Embodiment

Figure 6:
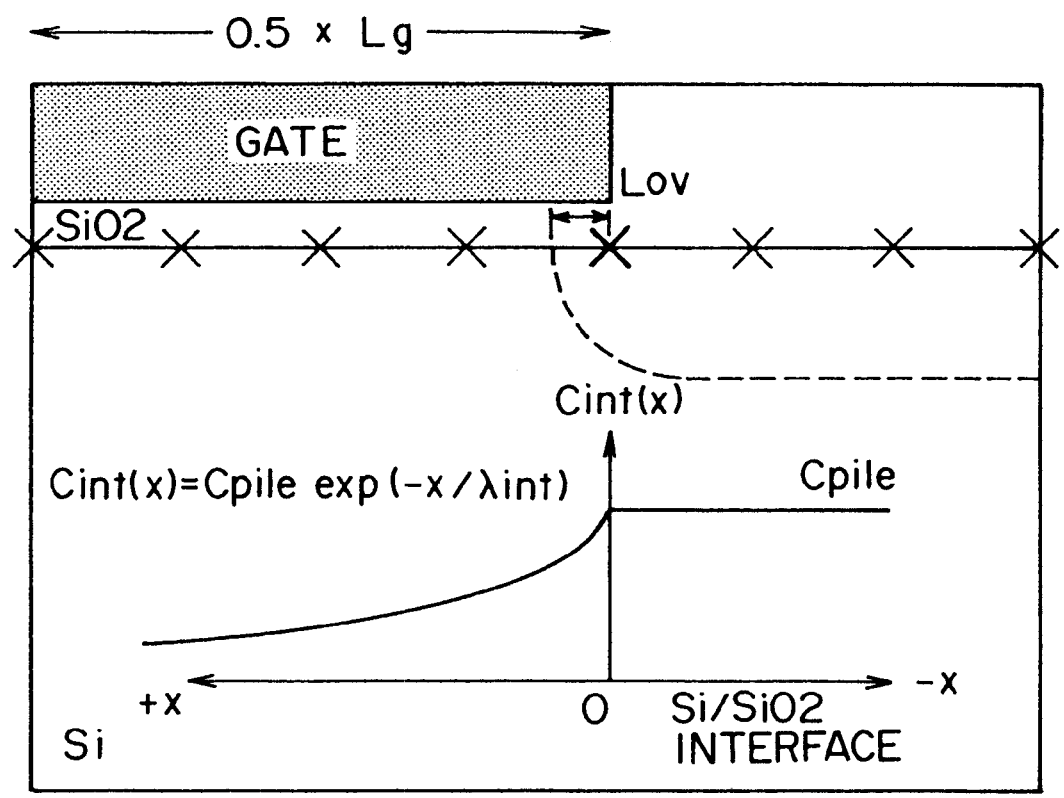
FIG. 6 is a schematic representation illustrating a fifth embodiment of a semiconductor modeling method according to the invention.

A fifth embodiment of a semiconductor modeling method according to the invention is described hereinafter with reference to FIG. 6.

The semiconductor modeling method according to the fifth embodiment of the invention is characterized in that in contrast to the semiconductor modeling method according to the first embodiment of the invention whereby impurity diffusion in the vertical direction (direction of height, or depth) is taken into account, impurity diffusion in the transverse direction (direction of channel) is also taken into account. With such a method, two-dimensional distribution of impurity pileup is constituted, so that the reverse short channel effect of the threshold voltage can be simulated in greater detail.

A method of effecting two-dimensional distribution of the impurity pileup amount as calculated by the semiconductor modeling method according to the first embodiment of the invention is described hereinafter.

First, a mask is set on a $SiO_2$ layer, and an impurity pileup amount is uniformly set on regions not covered with the mask. In contrast, in a region (channel region) covered with the mask, impurity pileups are set such that a pileup amount gradually decreases from the edges of the mask towards the interior thereof.

With such a method using the mask, it is possible to develop a model for the impurity pileups occurring to the edges of the gate as a result of, for example, S/D implantation.

The impurity pileup amounts in the vicinity of the edges of the mask (the edges of the gate) can be expressed by the following exponential function:

$$Cint(x)=Cpile \times \exp(-x/\lambda int) \qquad (5),$$

where Cint (x) denotes an impurity pileup amount on one of the cells at a $Si/SiO_2$ interface, Cpile a peak value of the impurity pileup amount, and $\lambda$ int an attenuation length of the pileup at the $Si/SiO_2$ interface, in the longitudinal direction of the channel.

With the semiconductor modeling method according to the fifth embodiment of the invention, it is possible to obtain a two-dimensional profile of the impurities such that impurity concentration is higher in the vicinity of the edges of the gate, in the channel region, declining towards the center of the channel {inner side of the gate (the mask)}. In this connection, if a gate length is set short, the channel region will be in a condition equivalent to the case where impurity concentration becomes higher throughout the substrate, due to the effect of regions of high impurity concentration, at the edges of the gate, resulting in an increase in the threshold voltage. Thus, with the semiconductor modeling method according to the fifth embodiment of the invention, it becomes possible to analyze the reverse short channel effect of the threshold voltage in greater detail.

Sixth Embodiment

Figure 7:
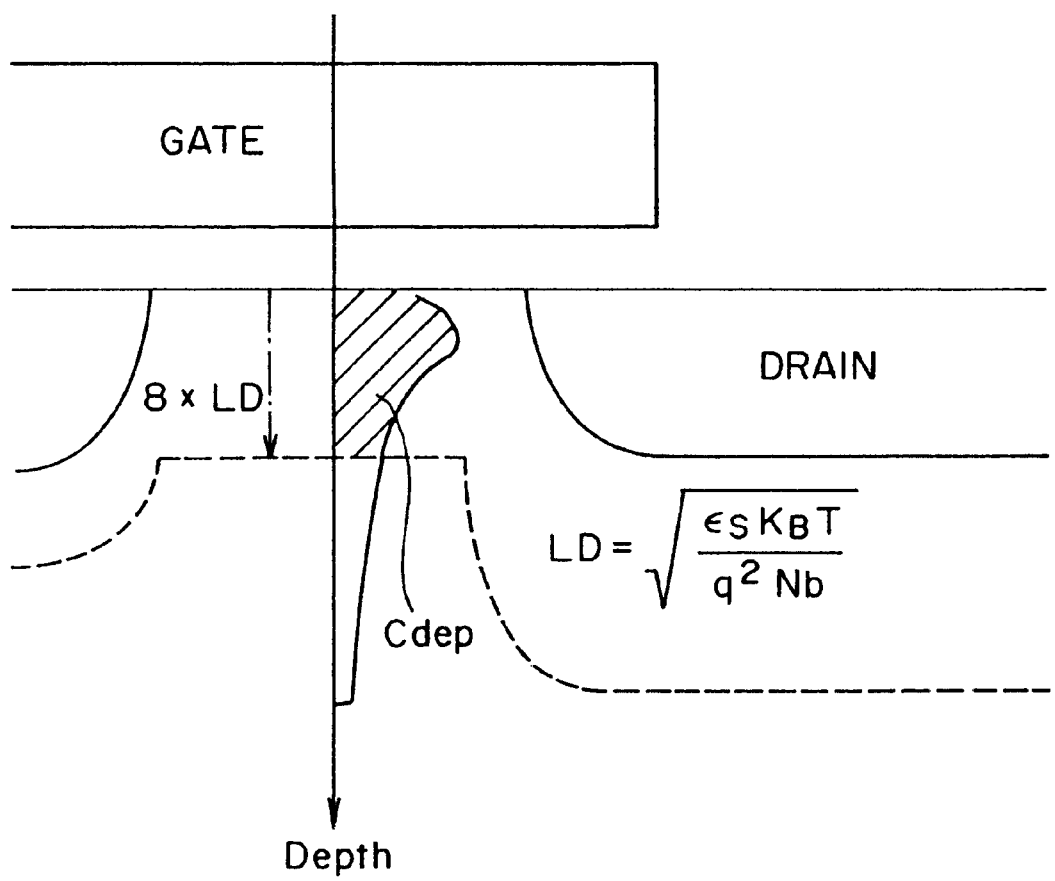
FIG. 7 is a schematic representation illustrating a sixth embodiment of a semiconductor modeling method according to the invention.

A sixth embodiment of a semiconductor modeling method according to the invention is described hereinafter with reference to FIG. 7.

The semiconductor modeling method according to the sixth embodiment of the invention is characterized in that a step of finding a peak value of an impurity pileup amount as the function of an impurity concentration in the substrate is further added to the semiconductor modeling method according to the fifth embodiment of the invention.

A peak value of the pileup amount at a $Si/SiO_2$ interface increases according as the impurity concentration in the substrate becomes higher. Accordingly, the higher the impurity concentration in the substrate, the more pronounced the reverse short channel effect of the threshold voltage becomes. The reverse short channel effect is dependent on dopant concentration in a depletion layer spreading in the direction of the depth of the substrate from the $Si/SiO_2$ interface. It is known that, in a state of thermal equilibrium, the width of the depletion layer, spreading in the direction of the depth of the substrate from the $Si/SiO_2$ interface, is generally in the order of 8×LD (device length) if the substrate is made of Si (By S. M. Sze; "Wiley—Interscience", 1981). With the semiconductor modeling method according to the sixth embodiment of the invention, the width of a depletion layer (in a state of thermal equilibrium), spreading in the direction of the depth of a channel region, positioned at a sufficient distance from the location of S/D implantation, is first calculated, and a peak value Cpile of the impurity pileup amount is given as the function of a total amount Cdep of dopants in the depletion layer:

$$Cpile=f(Cdep) \qquad (6)$$

The expression (6) can be expanded, for example, as follows:

$$f(Cdep)=aCdep^{\alpha}+bCdep^{\beta}+cCdep^{\gamma}+\ldots+z \qquad (7)$$

In the expression (7), all numerals other than Cdep are coefficients (fitting parameters).

Thus, with the semiconductor modeling method according to the sixth embodiment of the invention, since the peak value of the impurity pileup amount is expressed as the function of the impurity concentration in the substrate, it becomes possible to analyze process condition dependency of the reverse short channel effect of the threshold voltage. Furthermore, by simply increasing the number of terms on the right side of the expression (7), the results of simulation can be easily rendered to be in agreement with measured values.

Seventh Embodiment

A seventh embodiment of a semiconductor modeling method according to the invention is described hereinafter with reference to FIGS. 8 and 9.

The semiconductor modeling method according to the seventh embodiment of the invention works effectively in adjusting model parameters for expressing an anticipated reverse short channel effect.

Figure 16:
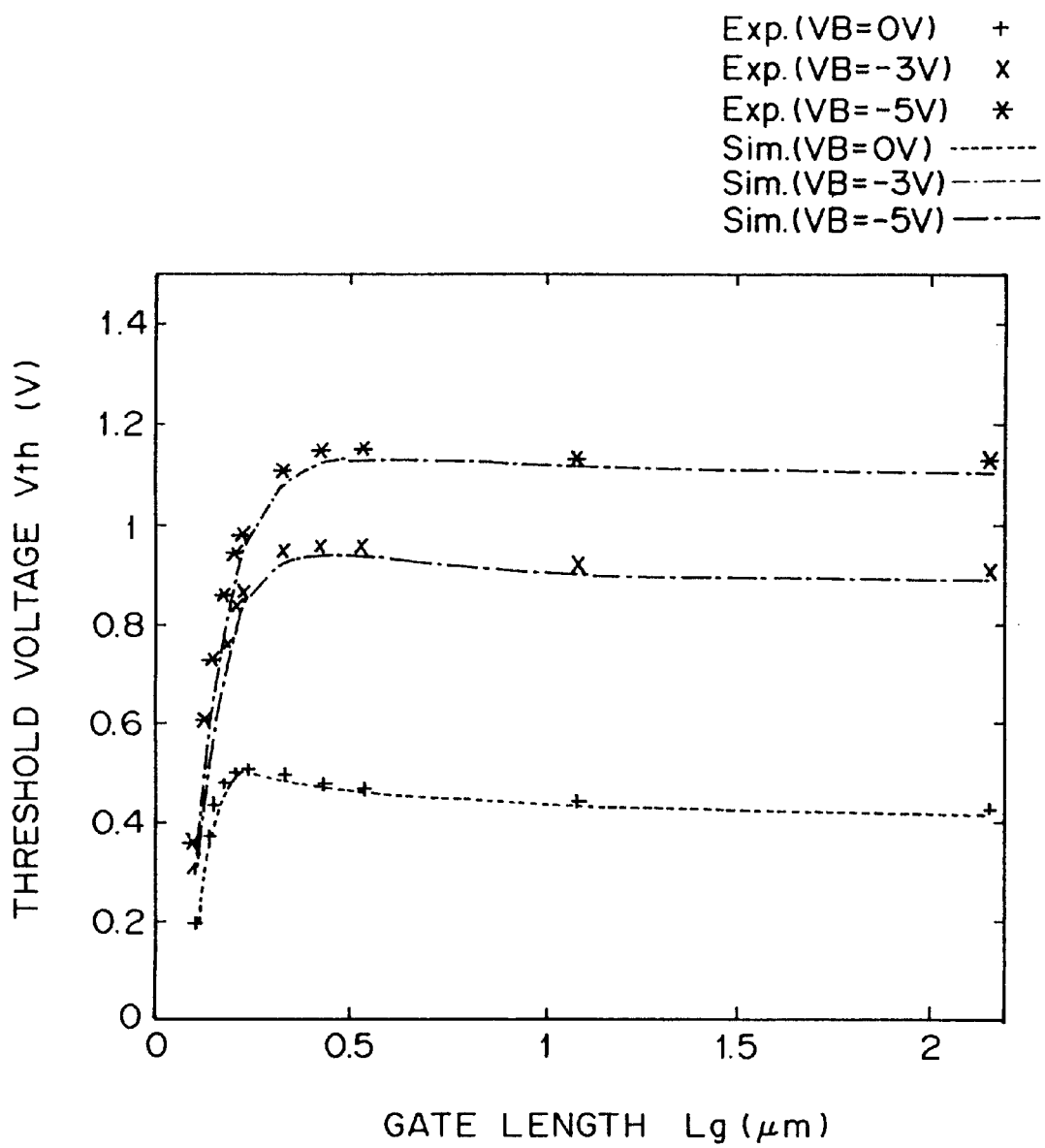
FIG. 16 is a diagram of a characteristic curve showing relationships between a gate length and threshold voltage.

First, with a threshold voltage Vth of a device having a long channel length (a long channel device)–substrate bias Vsub characteristic, adopted as the target of simulation, model parameters, determined regardless of a gate length Lg, such as impurity concentration Nsub in a substrate region, diffusion constant, segregation coefficient (chemical potential difference at a $Si/SiO_2$ interface), work function difference ΔWf between metal and semiconductor, and so forth, are adjusted {FIG. 8(1)}. Herein, the long channel device refers to a device whose gate length Lg is long, and in this case, distinction on whether the gate length Lg is long or short is drawn based on whether or not the threshold voltage Vth is maintained at a constant value regardless of variation in the gate length Lg. For example, in the case of the characteristic curve shown in FIG. 16, a device having the gate length Lg about 1 μm or longer is defined as a long channel device.

Subsequently, falloff of the threshold voltage Vth in a threshold voltage Vth–gate length Lg characteristic (referred to hereinafter as "Vth–Lg characteristic") is adjusted by an overlap length Lov between the gate and the drain {FIG. 8(2)}.

Further, magnitude (Vt, con dose level) of the Vth–Lg characteristic is adjusted by a peak value Cpile of an impurity pileup amount {FIG. 8(3*)}. A slope of the Vth–Lg characteristic curve is adjusted by a parameter λ int associated with attenuation of the impurity pileup amount, in the longitudinal direction of the channel {FIG. 8(4)}. The substrate bias dependency of the Vth–Lg characteristic is adjusted by a parameter λ bulk associated with a scope of regions where impurity migration takes place {FIG. 8(5)}. Thereafter, such steps of adjusting the parameters are repeated until agreement with the Vth–Lg characteristic as measured is reached. Herein, "Vt, con" refers to an impurity used for adjusting impurity concentration.

FIG. 9 indicates the model parameter dependency of impurity pileups.

Figure 9A:
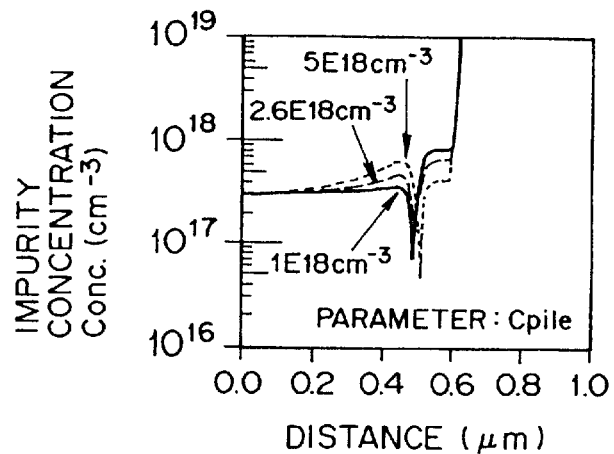
FIG. 9 is a schematic representation (2) illustrating a seventh embodiment of a semiconductor modeling method according to the invention.

FIG. 9(a) indicates a relationship between a distance of the channel, in the longitudinal direction thereof, at the Si/SiO$_2$ interface, and impurity concentration Conc., in the case of varying the parameter Cpile from 1×10$^{18}$ cm$^{-3}$, to 2.6×10$^{18}$ cm$^{-3}$, and 5×10$^{18}$ cm$^{-3}$. The location at 0.0 on the x corresponds to the center of the channel, and the same at 0.6 μm or more corresponds to the drain.

Figure 9B:
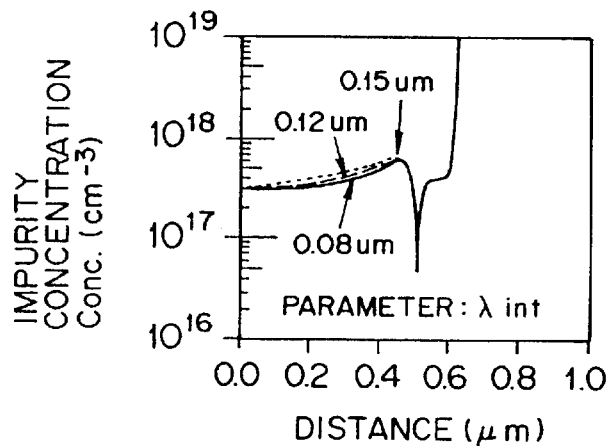

FIG. 9(b) indicates a relationship between a distance of the channel, in the longitudinal direction thereof, at the Si/SiO$_2$ interface, and impurity concentration Conc., in the case of varying the parameter λ int from 0.08 μm to 0.12 μm, and 0.15 μm. The location at 0.0 on the x-axis corresponds to the center of the channel, and the same at 0.6 μm or more corresponds to the drain.

Figure 9C:
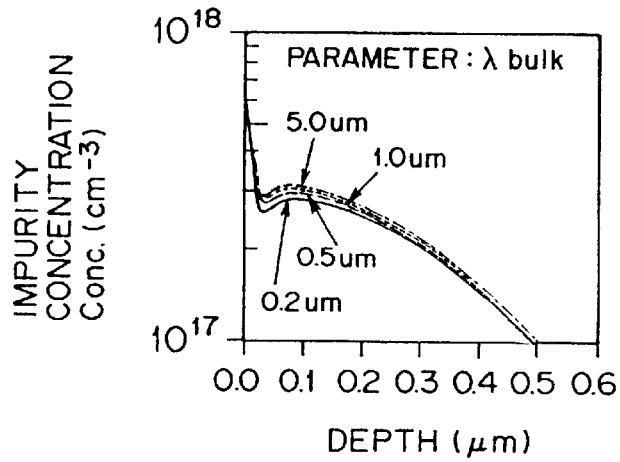

FIG. 9(c) indicates a relationship between a depth from the Si/SiO$_2$ interface, and impurity concentration Conc., in the case of varying the parameter λ bulk from 0.2 μm to 0.5 μm, 1.0 μm, and 5.0 μm. The x-axis indicates a depth of a location {for example, a location at about 0.45 μm from the center of the channel, refer to FIG. 9(b)} in the channel, having the highest impurity concentration, and the location at 0.0 on the x-axis corresponds to the Si/SiO$_2$ interface.

Thus, the semiconductor modeling method according to the seventh embodiment of the invention is characterized in that the model parameters which can be determined regardless of the gate length Lg are first adjusted after adopting a long gate length Lg, and subsequently, variation in the threshold voltage Vth when the gate length Lg is short is simulated by adjusting other parameters. Accordingly, not only efficient adjustment of the parameters can be attained but also adjustment of the parameters with high precision from a physical point of view can be executed. Further, with the semiconductor modeling method according to the seventh embodiment, scopes of adjustment for electrical characteristics correspond to the model parameters, so that the results of simulation can be easily rendered to be in agreement with the real electrical characteristics of a semiconductor.

Eighth Embodiment

An eighth embodiment of a semiconductor modeling method according to the invention is described hereinafter with reference to FIG. 10.

There are cases where with the Vth–Lg characteristics of semiconductors fabricated under different process conditions as the target, even if an attempt is made to adjust model parameters in such a way as to render results of simulation to be in agreement with actually measured values, model parameters common to respective processes can not be found, and consequently, model parameter values vary by the process condition. In this connection, with the semiconductor modeling method according to the eighth embodiment of the invention, an interpolation formula is derived from respective model parameters under the different process conditions, and the interpolation formula is applied to the respective processes in place of the model parameters.

If two kind of process conditions are involved, the interpolation formula will be a linear expression (linear equation), if three kind of process conditions are involved, the interpolation formula will be a quadratic expression, and if four kinds of process conditions are involved, the interpolation formula will be a cubic expression. FIG. 10 shows the interpolation formula when three kinds of process conditions, X1, X2, and X3, are involved and a process condition-model parameter λ int characteristic curve based on the interpolation formula:

$$\lambda int(x) = ax^2 + bx + c \tag{8}$$

With the semiconductor modeling method according to the eighth embodiment of the invention, even in the case where the process condition dependency of the target electrical characteristic (for example, the threshold voltage Vth) can not be expressed by a common model parameter, it is ensured that the target electrical characteristic can be obtained within a set scope of process conditions.

Ninth Embodiment

A ninth embodiment of a semiconductor modeling method according to the invention is described hereinafter with reference to FIG. 11.

In the case of a SOI (Silicon On Insulator) device having a plurality of silicon layers, separated by a SiO$_2$ layer, there exist a plurality of Si/SiO$_2$ interfaces, and the plurality of the Si/SiO$_2$ interfaces are classified physically into interfaces to which impurity pileup occurs, and interfaces to which impurity pileup does not occur.

Figure 11:
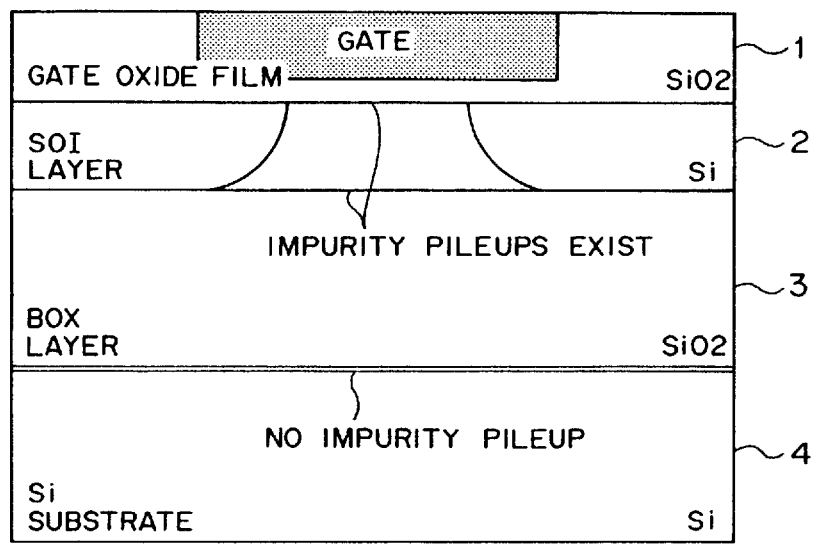
FIG. 11 is a schematic representation illustrating a ninth embodiment of a semiconductor modeling method according to the invention.

For example, as shown in FIG. 11, according to the SOI process, there exist an Si layer (SOI layer) 2 sandwiched between a gate oxide film (SiO$_2$ layer) 1 and a box layer (SiO$_2$ layer) 3, and another Si layer 4 which is the substrate. Of the two Si layers 2, 4, impurity pileup due to heat treatment does not occur to the Si layer 4 which is the substrate. Whether or not impurity pileup occurs depend on a relationship between an external atmosphere (gas, air) and the location of the respective layers. There is a possibility of impurity pileup occurring to the Si layer 2 directly beneath the gate oxide film 1 which is in contact with an external atmosphere, however, impurity pileup does not occur to the Si layer 4, located further beneath the box layer 3 which is beneath the Si layer 2.

Further, the SOI layer (Si layer) 2 has a Si/SiO$_2$ interface (on the front face side) formed with the gate oxide film (SiO$_2$ layer) 1, and a Si/SiO$_2$ interface (on the back face side) formed with the box layer (SiO$_2$ layer) 3. An impurity pileup amount occurring to one of the two interfaces differs from that occurring to the other.

With the semiconductor modeling method according to the ninth embodiment of the invention, parameters are selectively and separately adjusted with respect to the interfaces to which impurity pileup occurs, and the interface to which impurity pileup does not occur, and further, the parameters are selectively adjusted with respect to the two interfaces having a different impurity pileup amount, respectively. Accordingly, simulation results with high precision can be obtained.

The semiconductor modeling method according to the ninth embodiment of the invention is applicable to not only the SOI process but also to modeling of impurity pileup occurring to a Si/SiO$_2$ interface in the bulk MOSFET process, and the separation process (LOCOS, STI).

Figure 12:
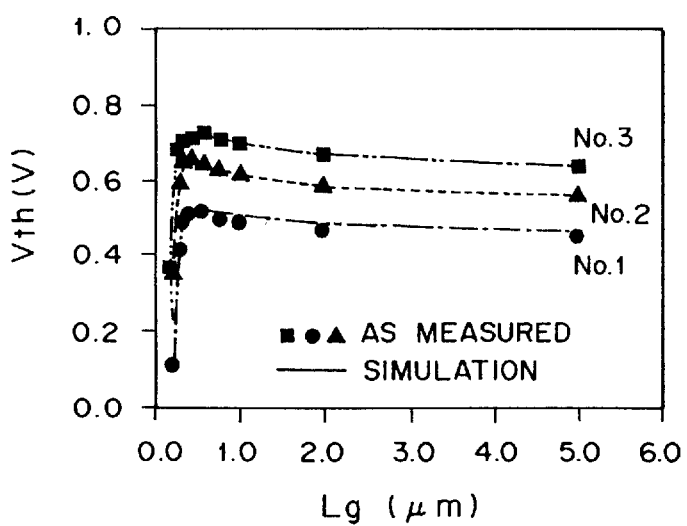
FIG. 12 is a diagram showing a threshold voltage—channel length characteristic curve as obtained by use of the semiconductor modeling method according to the respective embodiments of the invention.

The semiconductor modeling methods according to the first through the ninth embodiments of the invention have hereinbefore been described, and FIG. 12 shows Vth–Lg characteristic curves as obtained by use of these methods. Herein, the characteristic curves representing cases of three process conditions Nos. 1, 2, and 3, are shown, and in all the cases, simulation results closely analogous to the measured values have been obtained.

Having described the invention as related to the preferred embodiments with reference to the accompanying drawings, it is our intention that the invention be not limited by description of any of the embodiments. It will be obvious to those skilled in the art that various changes and modifications may be made without departing from the technical scope of the appended claims, and it is therefore to be understood to cover in the appended claims all such changes and modifications as fall within the true spirit and technical scope of the invention.

As described hereinbefore, with the semiconductor modeling method according to the invention, it is possible to simulate impurity pileup occurring to the Si/SiO$_2$ interface, and to analyze at a high speed electrical characteristics dependent on impurity concentration.

What is claimed is:

1. A semiconductor modeling method comprising:
   a first step of storing data on an SiO$_2$ layer;
   a second step of storm data on an Si layer formed so as to be in contact with the SiO$_2$ layer;
   a third step of dividing the Si layer into a plurality of regions, and setting an amount of impurity contained in the respective regions;
   a fourth step of setting an inter-regional migration amount of the impurity contained in the respective regions for a unit of time;
   a fifth step of constituting an impurity pileup part in a vicinity of an interface between the SiO$_2$ and the Si layer; and
   a sixth layer of calculating impurity distribution in the respective regions for every unit of time after completion of the first, second, third, fourth and fifth steps,
   the semiconductor modefling method being carried out without using diffusion equations.

2. A semiconductor modeling method according to claim 1, wherein the migration amount of the impurity is given as a function of a distance between a location of the impurity pileup part and a location from which the impurity has migrated.

3. A semiconductor modeling method according to claim 1 or wherein a portion of impurities is caused to migrate such that a total impurity amount after migration remains the same as a total impurity amount before migration.

4. A semiconductor modeling method according to claim 1, wherein the migration amount of the impurities is calculated such that impurity concentration in a region at a location from which the impurity has migrated does not become not higher than an intrinsic carrier concentration.

5. A semiconductor modeling method according to claim 1, wherein the impurity pileup part is constituted through multidimensional impurity diffusion in a direction of height from the interface and in a transverse direction along the interface.

6. A semiconductor modeling method according to claim 1, wherein a peak value of an impurity density at the impurity pileup part is given as a function of impurity concentration in the Si layer.

7. A semiconductor modeling method according to claim 1, wherein an impurity pileup part is constituted at one or not less than two other interfaces, other than the interface between the SiO$_2$ layer and the Si layer, under individual conditions for each of the other interface.

8. A semiconductor modeling method according to claim 1, wherein a reverse short channel effect of a threshold voltage in a semiconductor device is modeled.

9. A semiconductor modeling method according to claim 8, wherein two kinds of models for a semiconductor device are prepared on.

10. A semiconductor modeling method according to claim 8, wherein model parameters are determined for each of a plurality of process conditions for the semiconductor device, an interpolation formula is derived from the model parameters under the respective process conditions, and the interpolation formula is used as model parameters common to all processes.

11. A semiconductor modeling method according to claim 8, wherein the semiconductor device is formed by an SOI process.

12. A semiconductor modeling method according to claim 8, wherein the semiconductor device is formed by an LOCOS method.

13. A semiconductor modeling method comprising:
   storing data on an SiO$_2$ layer;
   storing data on an Si layer formed so as to be in contact with the SiO$_2$ layer;
   dividing the Si layer into a plurality of regions, and setting an amount of impurity contained in the regions;
   setting an inter-regional migration amount of the impurity contained in the regions for a unit of time;
   constituting an impurity pileup part in a vicinity of an interface between the SiO$_2$ layer and the Si layer; and
   calculating impurity distribution in the regions for every unit of time after completion of said storing data on an SiO$_2$ layer and on an Si layer, said dividing, said setting and said constituting,
   the semiconductor modeling method being carried out without using diffusion equations.

14. The semiconductor modeling method according to claim 13, wherein the migration amount of the impurity is given as a function of a distance between a location of the impurity pileup part and a location from which the impurity has migrated.

15. The semiconductor modeling method according to claim 13, wherein a portion of impurities is caused to migrate such that a total impurity amount after migration remains the same as a total impurity amount before migration.

16. The semiconductor modeling method according to claim 13, wherein the migration amount of the impurities is calculated such that impurity concentration in a region at a location from which the impurity has migrated does not become not higher than an intrinsic carrier concentration.

17. The semiconductor modeling method according to claim 13, wherein the impurity pileup part is constituted through multidimensional impurity diffusion in a direction of height from the interface and in a transverse direction along the interface.

18. The semiconductor modeling method according to claim 13, wherein a peak value of an impurity density a the impurity pileup part is given as a function of impurity concentration in the Si layer.

19. The semiconductor modeling method according to claim 13, wherein an impurity pileup part is constituted at one or not less than two other interfaces, other than the interface between the $SiO_2$ layer and the Si layer, under individual conditions for each of the other interfaces.

20. The semiconductor modeling method according to claim 13, wherein a reverse short channel effect a threshold voltage in a semiconductor device is modeled.

21. The semiconductor modeling method according to claim 20, wherein two kinds of models for a semiconductor device are prepared on the basis of a channel length, and model parameter for a semiconductor device having a shorter channel length are determined after determining model parameters for a semiconductor device having a longer channel length.

22. The semiconductor modeling method according to claim 20, wherein model parameters are determined for each of a plurality of process conditions for the semiconductor device, an interpolation formula is derived from the model parameters under the respective process conditions, and the interpolation formula is used as model parameters common to all processes.

23. The semiconductor modeling method according to claim 20, wherein the semiconductor device is formed by an SOI process.

24. The semiconductor modeling method according to claim 20, wherein the semiconductor device is formed by a LOGOS method.

* * * * *